United States Patent

Shimoe

[11] Patent Number: 5,874,868
[45] Date of Patent: Feb. 23, 1999

[54] LONGITUDINALLY COUPLED SURFACE ACOUSTIC WAVE RESONATOR FILTER HAVING DIFFERENT DISTANCES BETWEEN TRANSDUCERS

[75] Inventor: Kazunobu Shimoe, Kanazawa, Japan

[73] Assignee: Murata Manufacturing, Co., Ltd., Kyoto-fu, Japan

[21] Appl. No.: 775,012

[22] Filed: Dec. 27, 1996

[30] Foreign Application Priority Data

Dec. 28, 1995 [JP] Japan ............................ 7-343585

[51] Int. Cl.$^6$ .................... H03H 9/25; H03H 9/64
[52] U.S. Cl. .................... 333/193; 333/195; 310/313 B; 310/313 D
[58] Field of Search ................ 310/313 B, 313 R, 310/313 C, 313 D; 333/193–196

[56] References Cited

U.S. PATENT DOCUMENTS

| 4,649,357 | 3/1987 | Nagai et al. ................ 333/194 X |
| 5,309,126 | 5/1994 | Allen ........................ 333/193 |
| 5,392,013 | 2/1995 | Yamamto et al. ............ 33/195 |
| 5,426,339 | 6/1995 | Wright ..................... 310/313 B X |

FOREIGN PATENT DOCUMENTS

| 0 401 737 | 12/1990 | European Pat. Off. . |
| 0 569 977 | 11/1993 | European Pat. Off. . |
| 3-112210 A | 5/1991 | Japan ........................ 333/194 |
| 5-335881 A | 12/1993 | Japan ........................ 333/193 |
| A 8-191229 | 7/1996 | Japan . |

OTHER PUBLICATIONS

Patent Abstracts of Japan, vol. 004, No. 165, 15 Nov. 1980 for JP 55 115712 A, Sep. 5, 1980 (abstract only).

*Primary Examiner*—Robert Pascal
*Assistant Examiner*—Barbara Summons
*Attorney, Agent, or Firm*—Graham & James LLP

[57] ABSTRACT

A longitudinal coupling type SAW resonator filter achieves improved selectivity without increasing the insertion loss and is constructed so as to be more easily mass-produced. The longitudinal coupling type SAW resonator filter has a piezoelectric substrate and first, second and third sets of interdigital electrodes each including a pair of comb electrodes disposed on the piezoelectric substrate. A pair of reflectors are located on the opposite sides in the surface wave propagation direction of the area in which the first to third sets of interdigital electrodes are disposed. The distance between the centers of adjacent electrode fingers of the first and second sets of interdigital electrode and the distance between the centers of adjacent electrode fingers of the first and third sets of interdigital electrode are set to different values.

10 Claims, 9 Drawing Sheets

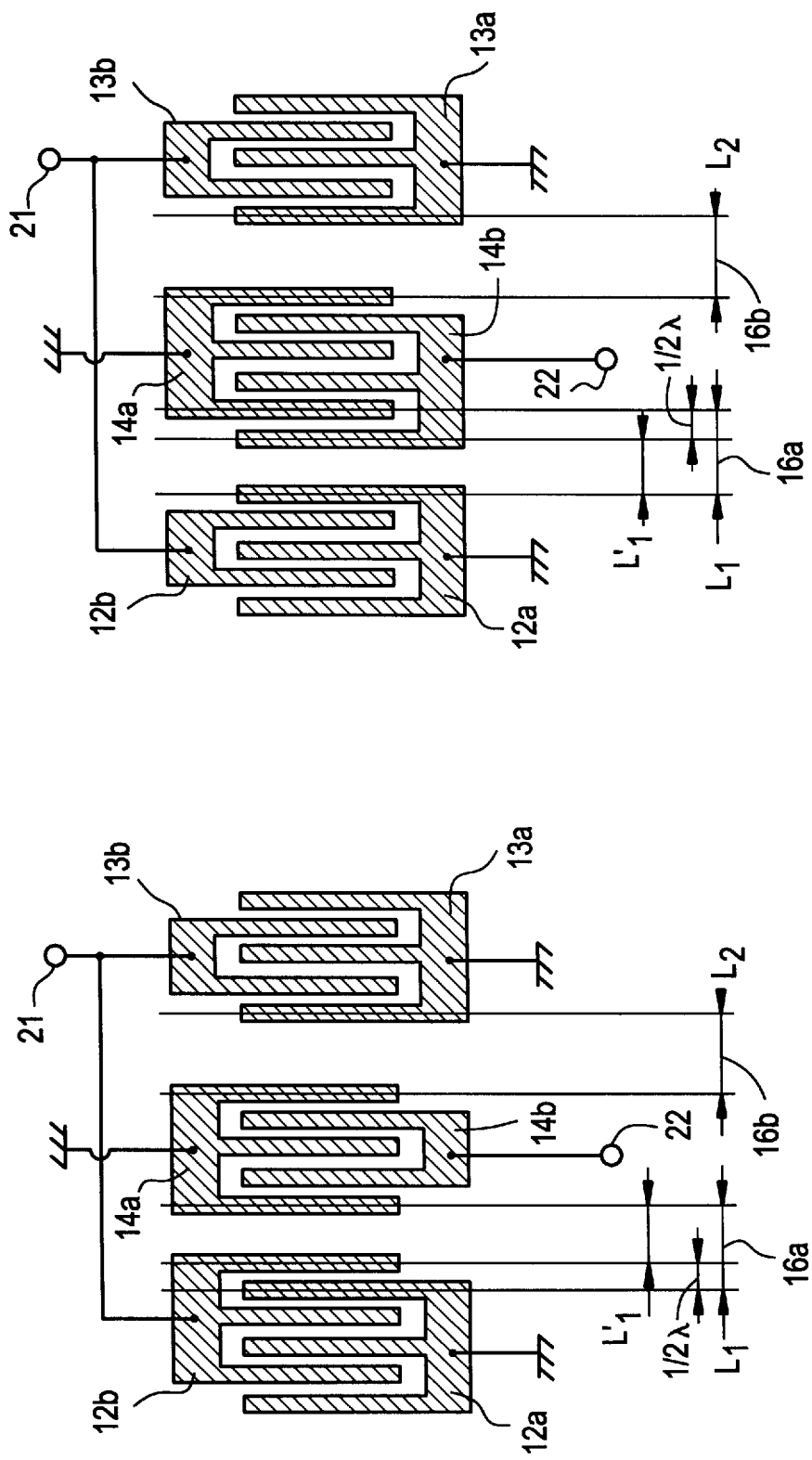

LONGITUDINALLY COUPLED SURFACE ACOUSTIC WAVE RESONATOR FILTER HAVING DIFFERENT DISTANCES BETWEEN TRANSDUCERS

BACKGROUND OF THE INVENTION

1. Field of the Invention

The present invention relates to longitudinally coupled surface acoustic wave resonator filters and, more particularly, to a longitudinally coupled surface acoustic wave resonator filter in which the electrode structure is improved so that the selectivity is increased.

2. Description of the Related Art

Recently, surface acoustic wave (SAW) filters have been used as band-pass filters for various communication devices. Such band-pass filters require a suitable pass band width and high selectivity. In addition, SAW filters used in radio-frequency (RF) stages require that a pass band be within a desired range and that high selectivity be achieved.

In particular, in the case of SAW filters used for RF stages in cordless telephone sets in accordance with the CT-1, CT-1+ and CT-2 standards, it is important to achieve a sufficiently large attenuation at points ±20 MHz and ±40 MHz apart from a center frequency, although the desired attenuation varies depending upon intermediate frequency (IF) filters used in the telephone sets. Thus, filters having higher selectivity are required. Also with respect to IF filters, characteristics of selectivity between adjacent channels are important.

On the other hand, it is known that, among SAW filters, those using SAW resonator filters are particularly effective in reducing the insertion loss, in increasing the stop-band attenuation and in reducing the size. For example, a filter has been proposed which includes longitudinally coupled SAW resonator filters connected in a multi-stage arrangement. Each SAW resonator filter is formed by arranging three interdigital transducers (IDTs) or three sets of interdigital transducers at equal intervals in a surface wave propagation direction on a piezo-electric substrate formed of a 36°-rotated Y-cut X-propagation $LiTaO_3$ or the like and by providing reflector electrodes at the opposite sides of the IDTs arrangement region which extend in the surface wave propagation direction. The filter thus arranged can operate with a smaller insertion loss and can be smaller in size.

In the above-described conventional longitudinally coupled SAW resonator filter, however, the attenuation in a stop-band which is higher than the pass band cannot be sufficiently increased.

FIG. 7 shows an example of an insertion loss-frequency characteristic of a filter including the above-described conventional longitudinally coupled SAW resonator filters connected in a two-stage arrangement. In FIG. 7, an essential portion of the characteristic represented by the solid line A is replotted as represented by the solid line B by enlarging the scale of the insertion loss, that is, using the scale on the right-hand side of the ordinate.

The characteristic curve shown in FIG. 7, representing the characteristic of the structure formed of the conventional longitudinally coupled SAW resonator filters in a two-stage connection having a pass band set at 864 to 868 MHz, has an increase at a frequency higher than the pass band due to a response of the IDTs (as indicated by arrow C in FIG. 7), which shows that the attenuation in the range of about 886 to 906 MHz is not sufficiently large.

The above-mentioned response of the IDTs is caused by internal reflection in the IDTs. Therefore, the level of the response depends upon the film thickness and line width of each of the fingers of the IDTs. For this reason, the method of increasing the film thickness of electrode fingers or reducing the line width of electrode fingers in a manufacturing process to set the desired attenuation in the above-mentioned range has been used as a method for reducing the level of undesirable response of the IDTs.

However, if the film thickness of the electrode fingers is increased, the propagation loss of surface waves propagating in the IDTs is increased, resulting in an increase in insertion loss. If the line width of the electrode fingers is increased, the electrical resistance through each electrode finger is increased, also resulting in an increase in insertion loss.

As conventional design methods for increasing the selectivity of SAW filters, a new phase weighting method (Shingaku Giho US81-22) and a method of forming a split electrode structure in some of the IDTs to limit internal reflection in the IDTs are known.

Of these methods, however, the former method requires a troublesome operation for designing weighted IDTs and also requires that an increased number of electrode fingers be thinned out. Therefore, this method inherently experiences the problem of an increase in impedance or an increase in the length of the IDTs.

The latter method uses a split electrode having electrode fingers, the width of which is half the line width of the ordinary electrode fingers, i.e., single electrodes. Therefore, this method requires advanced processing techniques such as dry etching techniques if it is used for filters of 800 MHz or higher bands. It also experiences the problem of a reduction in yield mainly because it is difficult to control the line width of electrode fingers of each IDT in the mixed arrangement of the single electrodes and the split electrodes.

SUMMARY OF THE INVENTION

The preferred embodiments of the present invention overcome the problems described above by providing a longitudinally coupled SAW resonator filter which achieves high selectivity without increasing the insertion loss and which is capable of being mass-produced as easy as conventional devices.

According to one preferred embodiment of the present invention, there is provided a longitudinally coupled SAW resonator filter comprising a substrate made of a piezoelectric material or a substrate having a piezoelectric thin film formed thereon, and first, second and third IDTs disposed on the piezoelectric substrate or in contact with the piezoelectric thin film. The second and third IDTs are preferably located on the opposite sides of the first IDT and extend in a direction of propagation of surface waves excited and received by the first IDT. The filter also comprises first and second reflectors located at the opposite sides in the surface wave propagation direction of the area in which the first to third IDTs are provided. Each of the first to third IDTs preferably includes a pair of comb electrodes each having at least one electrode finger. A distance $L_1$ between centers of the electrode finger of the first IDT and the electrode finger of the second IDT located adjacent to each other and a distance $L_2$ between centers of the electrode finger of the first IDT and the electrode finger of the third IDT located adjacent to each other are preferably set to different values.

In the longitudinally coupled SAW resonator filter of the preferred embodiments of the present invention having the first to third IDTs disposed on the substrate made of a piezoelectric material or the substrate having a piezoelectric film formed thereon and the first and second reflectors provided on the opposite side of the area in which the first to third IDTs are provided, the distances $L_1$ and $L_2$ are preferably set to different values. A high-selectivity characteristic can be achieved by using two resonant modes determined by the center distances $L_1$ and $L_2$. The reason for this effect will become apparent from the following detailed description of preferred embodiments of the present invention.

According to the preferred embodiments of the present invention, a piezoelectric single crystal of $LiTaO_3$, $LiNbO_3$, quartz or the like or a lead titanate-zirconate piezoelectric ceramic may be used as the material for forming the above-mentioned piezoelectric substrate. On the other hand, as the above-mentioned substrate having a piezoelectric thin film formed thereon, a substrate may be provided by forming a piezoelectric thin film of $ZnO$, $Ta_2O_5$ or the like on a surface of an insulating member made of an insulating ceramic such as alumina or any other insulating material or on the upper surface of the above-described piezoelectric substrate.

The first to third IDTs may be formed on the piezoelectric substrate or in contact with the piezoelectric thin film. The method of forming the IDTs in contact with the piezoelectric thin film preferably comprises a method of forming the first to third IDTs on the piezoelectric thin film or a method of forming the first to third IDTs between the substrate and the piezoelectric thin film.

The first to third IDTs may be formed of a suitable electroconductive material, e.g., Al or an Al alloy. Each of the first to third IDTs includes a pair of comb electrodes each having at least one electrode finger. The electrode fingers of the comb electrodes are arranged in an interdigital manner.

The first and second reflectors are provided to confine surface acoustic waves in the region between the first and second reflectors. Ordinarily, each of the first and second reflectors has a plurality of electrode fingers arranged substantially perpendicularly to the surface wave propagation direction. The first and second reflectors may also be formed of a suitable electroconductive material. Preferably, they are formed of the same material as the first to third IDTs, e.g., Al or an Al alloy.

The longitudinally coupled SAW resonator filter of the preferred embodiments of the present invention is characterized by setting the distances $L_1$ and $L_2$ to different values in the three-IDT type SAW resonator filter having first to third IDTs and first and second reflectors arranged as described above. The selectivity of the filter is improved by utilizing two resonant modes determined by the two distances, as will be apparent from the following description of the preferred embodiments of the present invention.

Preferably, according to the preferred embodiments of the present invention, when each of the first and second reflectors has a plurality of electrode fingers arranged substantially perpendicularly to the surface wave propagation direction, and the wavelength of surface waves determined by the electrode when finger pitch of the reflectors is $\lambda$, the distances $L_1$ and $L_2$ are set to such values that the distance $L_1$ satisfies an inequality (1):

$$0+n\lambda \leq L_1 \leq \lambda/2+n\lambda \qquad (1)$$

($n$: an integer), the distance $L_2$ satisfies an inequality (2):

$$\lambda/2+m\lambda \leq L_2 \leq (m+1)\lambda \qquad (2)$$

($m$: an integer), and the distance $L_1$ and the distance $L_2$ satisfy an inequality (3):

$$L_1 \neq L_2 - \lambda/2 + k\lambda \qquad (3)$$

($k$: an integer).

Thus, as will be apparent from the following description of the preferred embodiments, a longitudinally coupled SAW resonator filter reliably achieving a desired pass band width and having improved selectivity is provided.

According to another preferred embodiment of the present invention, there is provided a multiple-IDT longitudinally coupled surface acoustic wave resonator filter comprising a piezoelectric substrate made of a piezoelectric material or a substrate having a piezoelectric thin film disposed thereon, and first to Xth (X: an integer equal to or larger than 4) IDTs disposed on the piezoelectric substrate or in contact with the piezoelectric thin film. The second to Xth IDTs are arranged to extend along a direction of propagation of surface waves excited and received by the first IDT. The filter also comprises first and second reflectors located on the opposite sides in the surface wave propagation direction of the area in which the first to Xth IDTs are provided. Each of the IDTs preferably includes a pair of comb electrodes each having at least one electrode finger. If the distances between adjacent-end electrode fingers of adjacent pairs of IDTs are $L_1, L_2, \ldots L_{X-1}$, the distances satisfy equations (4) and (5):

$$L_S = L_1 = L_3 = L_5 \ldots \qquad (4)$$

$$L_A = L_2 = L_4 = L_6 \ldots \qquad (5)$$

If the wavelength of surface waves determined by the electrode finger pitch of the reflectors is $\lambda$, the distances $L_S$ and $L_A$ satisfy inequalities (6) and (7):

$$0+n\lambda \leq L_S \leq \lambda/2+n\lambda \qquad (6)$$

($n$: integer)

$$\lambda/2+m\lambda \leq L_A \leq (m+1)\lambda \qquad (7)$$

($m$: integer)

or inequalities (8) and (9):

$$\lambda/2+n\lambda \leq L_S \leq (n+1)\lambda \qquad (8)$$

($n$: integer)

$$0+m\lambda \leq L_A \leq \lambda/2+m\lambda \qquad (9)$$

($m$: integer), and the distances $L_S$ and $L_A$ satisfy an inequality (10):

$$L_S \neq L_A - \lambda/2 + k\lambda \qquad (10)$$

($k$: integer).

Thus, a longitudinally coupled SAW resonator filter capable of reliably achieving the desired pass band width and having improved selectivity is provided.

According to still another preferred embodiment of the present invention, there is provided a component including a plurality of longitudinally coupled SAW resonator filter devices comprising a substrate, in accordance with the preferred embodiments of the present invention. The plurality of longitudinally coupled SAW resonator filters are disposed on the substrate and connected in series to each other. That is, on one substrate, a plurality of longitudinally coupled SAW resonator filters of the preferred embodiments of the present invention may be formed and may be connected in series. In this manner, a filter having further improved selectivity can be provided.

According to a further preferred embodiment of the present invention, there is provided a SAW resonator filter device comprising a longitudinally coupled SAW resonator filter in accordance with a first preferred embodiment of the present invention described above, and at least one of another conventional longitudinally coupled SAW resonator filter, a transversely coupled SAW resonator filter and a trap filter using a SAW resonator formed on the substrate of the longitudinally coupled SAW resonator filter of the first preferred embodiment of the present invention and electrically connected to the longitudinally coupled SAW resonator filter of the first preferred embodiment of the present invention.

As described above, the SAW resonator filter device of the preferred embodiments of the present invention may be electrically connected to any other SAW resonator filter, a trap filter and the like. Preferably, in such a case, other devices are constructed on the piezoelectric substrate constituting the SAW resonator filter device of the preferred embodiments of the present invention. In this manner, a smaller integrated SAW resonator filter device can be provided.

These and other elements, features, and advantages of the preferred embodiments of the present invention will be apparent from the following detailed description of the preferred embodiments of the present invention, as illustrated in the accompanying drawings.

BRIEF DESCRIPTION OF THE DRAWINGS

FIGS. 8A and 8B are schematic plan views of a portion where IDTs are formed, showing cases where the distance is apparently changed when an electrode finger is added;

DETAILED DESCRIPTION OF PREFERRED EMBODIMENTS

The present invention will be described below in detail with respect to preferred embodiments thereof.

Figure 1:
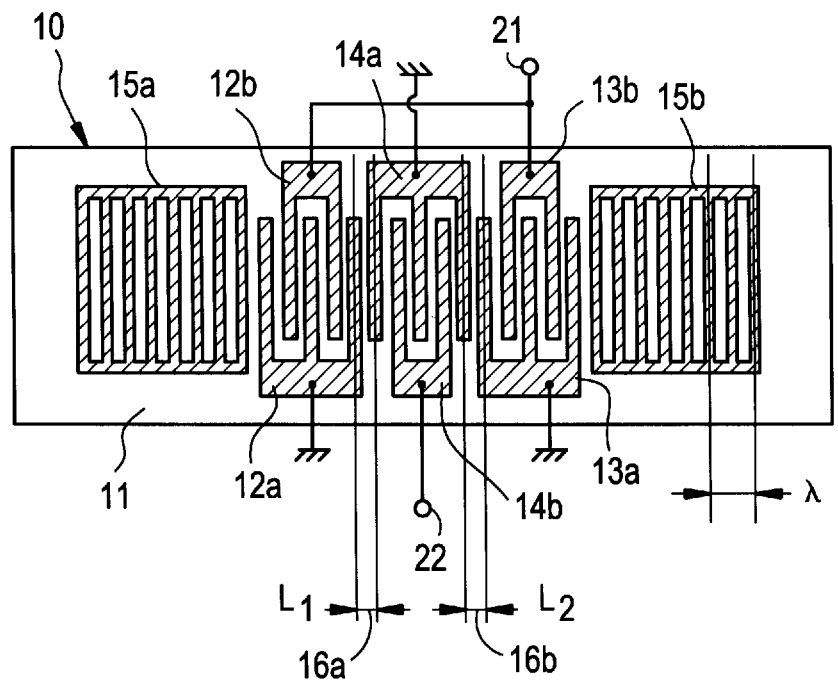
FIG. 1 is a plan view of the structure of a SAW resonator filter according to a first preferred embodiment of the present invention.

Referring to FIG. 1, a SAW resonator filter 10 which illustrates a preferred embodiment of the present invention is constructed on a piezoelectric substrate 11 preferably having a substantially rectangular shape. In this preferred embodiment, the piezoelectric substrate 11 is preferably formed of 36°-rotated Y-cut X-propagation $LiTaO_3$.

A pair of comb electrodes 14a and 14b forming a first IDT are disposed on a central portion of the piezoelectric substrate 11. The comb electrode 14a is connected to ground while the comb electrode 14b is connected to an input/output terminal 22. The comb electrodes 14a and 14b have electrode fingers arranged in an interdigital manner.

Second and third IDTs are located on the opposite sides in the surface wave propagation direction of the first IDT formed of the comb electrodes 14a and 14b. The second IDT is formed of comb electrodes 12a and 12b while the third IDT is formed of comb electrodes 13a and 13b.

Each of the pair of comb electrodes 12a and 12b and the pair of comb electrodes 13a and 13b have electrode fingers arranged in an interdigital manner, as do the comb electrodes 14a and 14b. However, the comb electrodes 12b and 13b having a smaller number of electrode fingers are disposed on the same side as the comb electrode 14a of the first IDT having a larger number of electrode fingers.

The comb electrodes 12b and 13b are connected in common to an input/output terminal 21 while the comb electrodes 12a and 13a are connected to ground.

Reflectors 15a and 15b are disposed on the opposite sides in the surface wave propagation direction of the area in which the first to third IDTs are formed. Each of the reflectors 15a and 15b preferably has electrode fingers arranged at equal pitches and each extending in a direction substantially perpendicular to the surface wave propagation direction.

The above-described comb electrodes 12a, 12b, 13a, 13b, 14a, and 14b and the reflectors 15a and 15b are preferably formed by forming an Al or Al alloy film on the piezoelectric substrate 11 and processing this film by photolithography and etching.

One of the novel features of this preferred embodiment resides in that the value of the distance $L_1$ between the centers of the electrode fingers at the adjacent ends of the first and second IDTs is within the range defined by the above-mentioned inequality (1), that the value of the distance $L_2$ between the centers of the electrode fingers at the adjacent ends of the first and third IDTs is set so as to satisfy the above-mentioned inequality (2), and that the distances $L_1$ and $L_2$ are set so as to satisfy the above-mentioned inequality (1) or (3). The symbol $\lambda$ in the inequality (3)

represents the wavelength determined by the electrode fingers pitch of the reflectors 15a and 15b (see FIG. 1).

In the SAW resonator filter of this preferred embodiment, since the distances $L_1$ and $L_2$ are set so as to satisfy the above-described conditions, the selectivity can be improved in comparison with the conventional longitudinally coupled SAW resonator filter. The principle of the operation and design conditions of the SAW resonator filter of this preferred embodiment will be described in the following paragraphs.

The principle of the operation of longitudinally coupled SAW resonator filters generally used will first be described.

Conventional three-IDT longitudinally coupled type SAW resonator filters have generally the same structure as that of the SAW resonator filter shown in FIG. 1 illustrating a preferred embodiment of the present invention except for the above-described relationship between the distances $L_1$ and $L_2$. Therefore, the principle of the operation of conventional longitudinally coupled SAW resonator filters will be described with reference to FIG. 1. In conventional three-IDT longitudinally coupled SAW resonator filters, the distance $L_1$ between the centers of the electrode fingers at the adjacent ends of the first IDT (comb electrodes 14a and 14b) and the second IDT (comb electrodes 12a and 12b) and the distance $L_2$ between the centers of the electrode fingers at the adjacent ends of the first IDT (comb electrodes 14a and 14b) and the third IDT (comb electrodes 13a and 13b) are equal to each other. That is, $$L_1=L_2=L.$$

Figure 2:
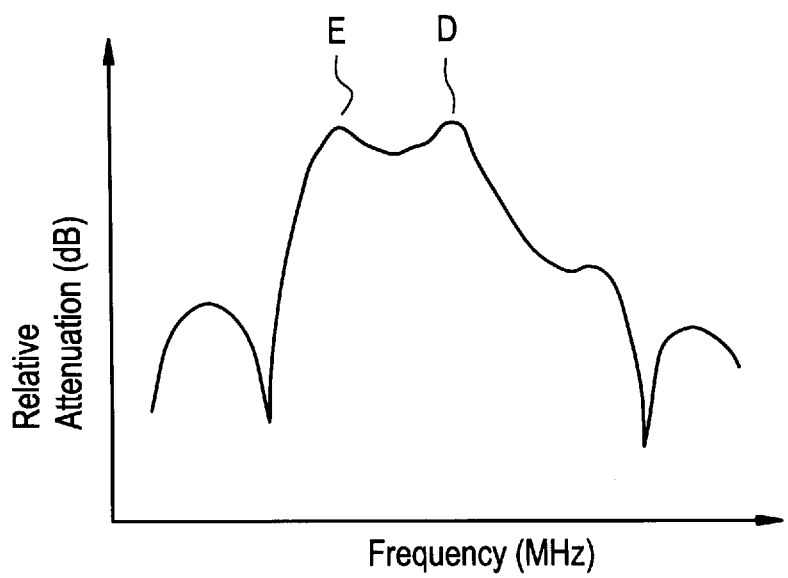
FIG. 2 is a diagram showing a frequency characteristic of a conventional SAW resonator filter having the structure shown in FIG. 1 but having equal distances $L_1$ and $L_2$ and having the number of electrode fingers of the reflectors set to zero.

FIG. 2 shows a frequency characteristic in the case where the number of electrode fingers of the reflector electrodes in the conventional three-IDT longitudinally coupled SAW resonator filter having equal center distances $L_1$ and $L_2$ is set to zero. A peak indicated by the arrow D in FIG. 2 is considered to correspond to a resonant mode due to multiple reflection between the first and second IDT or multiple reflection between the first and third IDT, and a peak indicated by the arrow E is considered to be corresponding to an internal resonant mode of the IDT.

As conventional longitudinally coupled resonator filters, longitudinally coupled double mode filters have been constructed by using the two resonant modes indicated by the arrows D and E. Longitudinally coupled triple mode filters have also been realized by using these resonant modes and another resonant mode due to multiple reflection between the reflectors 15a and 15b at a frequency lower than the frequency of the resonant mode indicated by the arrow E in the case of adding the reflectors 15a and 15b.

Figure 7:
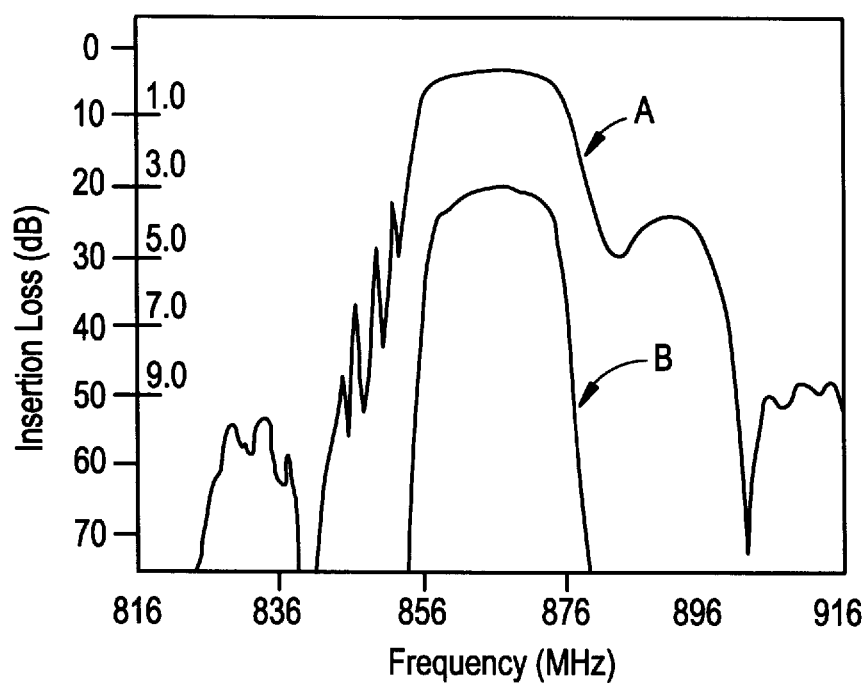
FIG. 7 is a diagram showing an example of an insertion loss-frequency characteristic of a conventional SAW resonator filter.

FIG. 7 shows a typical characteristic of conventional longitudinally coupled resonator filters in two-stage serial connection designed on the basis of the above-described principle. As described above, a filter having this structure has a small insertion loss but has unsatisfactory selectivity at frequencies higher than the pass band. That is, the attenuation in a frequency range higher than the center frequency by about +20 to 30 MHz is at most 25 dB.

Figure 3:
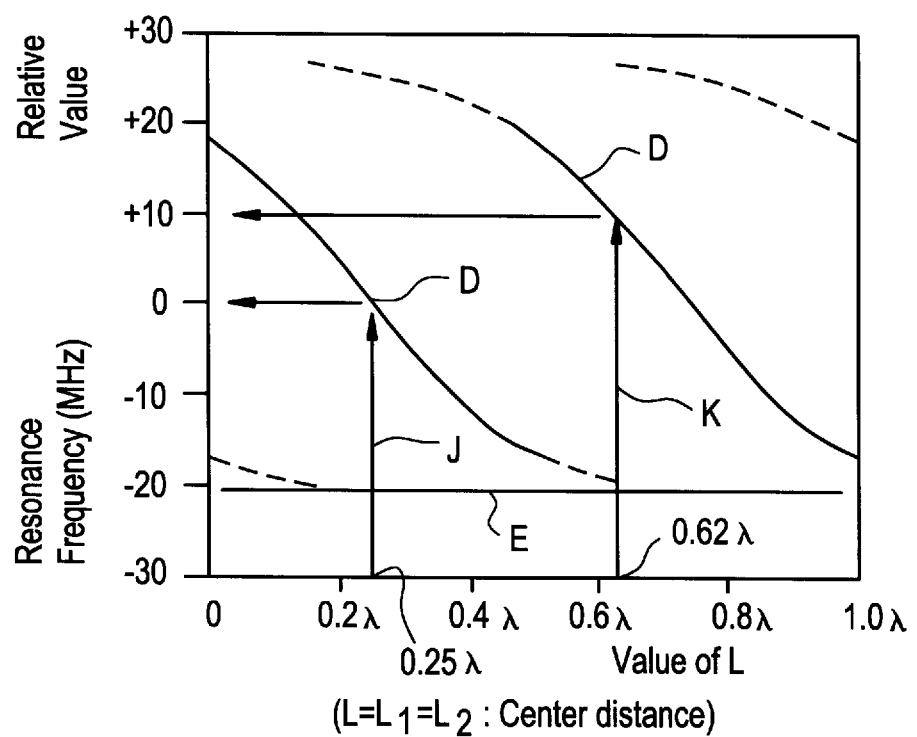
FIG. 3 is a diagram showing a distance $L=L_1=L_2$ and relative resonance frequencies in the SAW resonator filter having the structure shown in FIG. 1.

The resonance frequencies of the above-mentioned resonant modes D and E are determined by the value of the distance L (=$L_1$=$L_2$). FIG. 3 shows the relative positions of the resonant modes D and E with the distance L used as a parameter. The characteristics shown in FIG. 3 are of a SAW filter arranged by setting the number of electrode fingers of the first IDT, i.e., the sum of the numbers of electrode fingers of the comb electrodes 14a and 14b to 57, the number of electrode fingers of the second IDT (comb electrodes 12a and 12b) to 31, the number of electrode fingers of the third IDT (comb electrodes 13a and 13b) to 31, and the number of electrode fingers of each of the reflectors 15a and 15b to 0, and by using a 36°-rotated Y-cut X-propagation LiTaO$_3$ substrate as piezoelectric substrate 11, the SAW filter having a center frequency of 866 MHz.

As can be understood from FIG. 3, the resonance frequency the resonant mode E is not dependent on the value of the distance L, but the resonance frequency of the resonant mode D decreases as the value of L increases. When the distance L becomes equal to about 0.45λ, a mode conversion from the resonant mode D into the resonant mode E starts. As the value of the distance L increases further, the resonant mode D is completely converted into the resonant mode E and new resonant mode D appears from the high-frequency side.

In contrast, in the above-described preferred embodiment of the present invention, resonance is excited in two resonant modes D by setting the center distances $L_1$ and $L_2$ to different values, as explained below with reference to FIG. 4.

Figure 4:
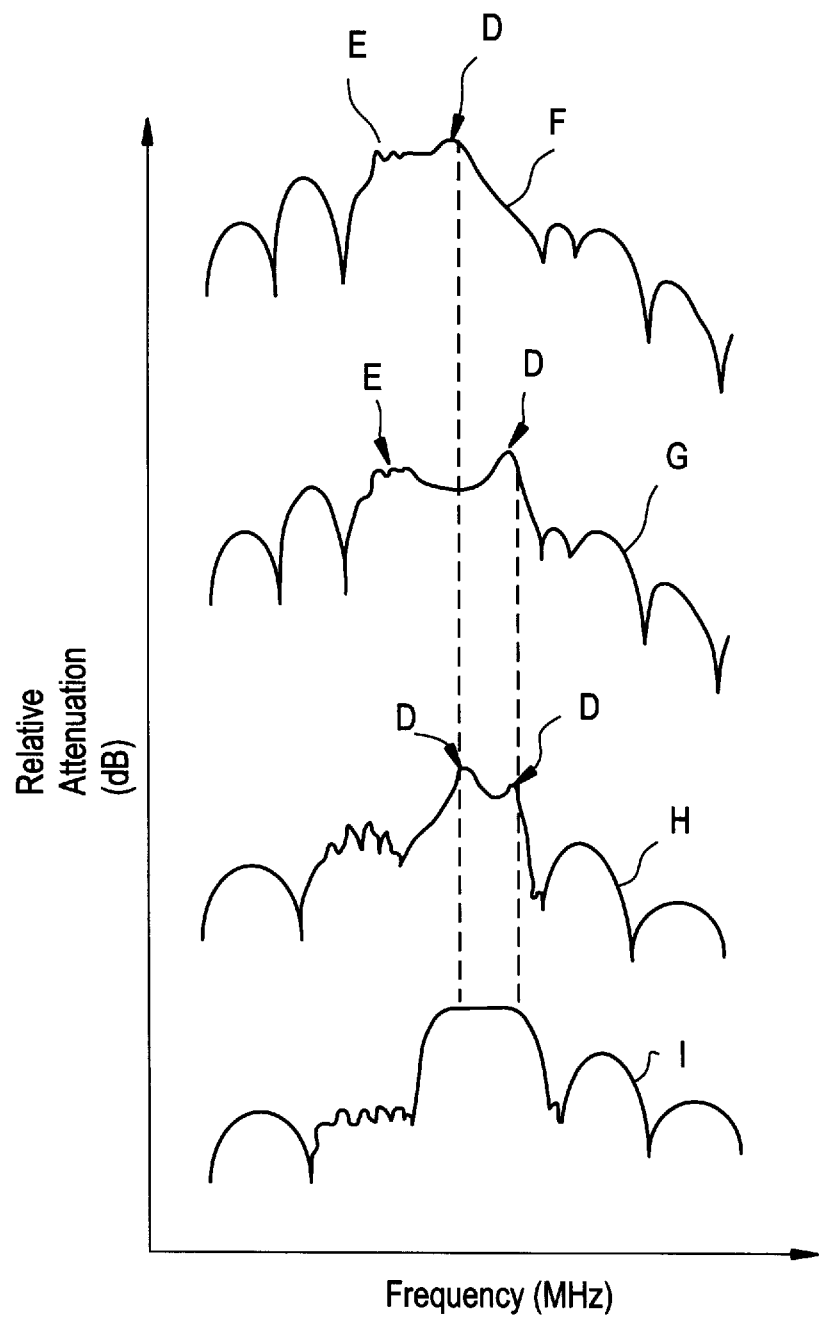
FIG. 4 is a diagram for explaining the principle of operation of a SAW resonator filter having the electrode structure shown in FIG. 1 and arranged in accordance with the first preferred embodiment of the present invention.

FIG. 4 shows the results of one preferred embodiment constructed by setting the number of electrode fingers of the first IDT, i.e., the sum of the numbers of electrode fingers of the comb electrodes 14a and 14b to 57, the number of electrode fingers of the second IDT, i.e., the sum of the numbers of electrode fingers of the comb electrodes 12a and 12b to 31, the number of electrode fingers of the third IDT to 31, and the number of electrode fingers of each of the reflectors 15a and 15b to 150.

Characteristics F and G shown in FIG. 4 are shown for comparison with the preferred embodiment of the present invention. Characteristic F was obtained by setting $L_1$=$L_2$=0.25λ and characteristic G was obtained by setting $L_1$=$L_2$=0.62λ. On the other hand, characteristic H shown in FIG. 4 was obtained by setting the distances $L_1$ and $L_2$ to different values: $L_1$=0.25λ, and $L_2$=0.62λ.

Two resonant modes occurred with respect to each of the characteristics F and G shown in FIG. 4. The peak at a higher frequency corresponds to the above-described resonant mode D while the peak at a lower frequency corresponds to the above-described resonant mode E. In the characteristics F and G shown in FIG. 4, the resonant mode E occurs at the end of the reflection band of the reflector, so that the peak is rugged.

In contrast, in the characteristic H shown in FIG. 4, substantially no resonant mode E is recognized but two resonant modes D appear. The resonant mode D of a higher frequency occurs due to multiple reflection between the first IDT (comb electrodes 14a and 14b) and the third IDT (comb electrodes 13a and 13b) determined by the distance $L_2$ while the resonant mode D of a lower frequency occurs due to multiple reflection between the first IDT (comb electrodes 14a and 14b) and the second IDT (comb electrodes 12a and 12b) determined by the distance $L_1$.

Also, a double mode filter having a favorable characteristic such as indicated by I in FIG. 4 can be provided by adjusting the finger overlap of the first to third IDT and/or by adding an external matching circuit.

The pass band width of SAW resonator filters having characteristics such as indicated by H and I in FIG. 4 is determined by the difference between the values of the distances $L_1$ and $L_2$ and can be freely selected by adjusting these distances, as described below with reference to FIG. 3.

For example, the distance $L_1$=0.25λ is selected to set a reference resonance frequency (0 MHz in terms of relative value, indicated by the arrow J in FIG. 3), at which resonant mode D occurs between the comb electrodes 12a and 12b and the comb electrodes 14a and 14b. With respect to this frequency, if $L_2=0.62\lambda$ is selected, resonant mode D occurs between the comb electrodes 13a and 13b and the comb electrodes 14a and 14b at a frequency higher by 10 MHz as indicated by arrow K in FIG. 3. By using these two resonant modes D, a band pass filter having a pass band width of 10 MHz at 800 to 900 MHz SAW filter can be obtained.

To increase the band width, the distance $L_1$ may be set to a value larger than the above-mentioned value or the distance $L_2$ may be set to a value smaller than the above-mentioned value. Conversely, to reduce the band width, the distance $L_1$ may be reduced or the distance $L_2$ may be increased. Under the characteristic conditions shown in FIG. 3, it is theoretically possible to realize a filter having a band width of 40 MHz at the maximum.

With respect to the conditions shown in FIG. 3, a similar filter may be arranged by selecting center distance $L_1=0.12\lambda$ and center distance $L_2=0.25\lambda$. In this filter, however, resonant mode D corresponding to the distance of $0.12\lambda$ and resonant mode D corresponding to the distance of $0.25\lambda$ do not couple with each other because of the phase relationship therebetween. This filter is obtained as a double mode filter in which resonant mode D corresponding to the distance of $0.25\lambda$ and resonant mode E couple with each other.

Accordingly, with respect to wavelength $\lambda$, it is necessary to select distances $L_1$ and $L_2$ so as to satisfy the above-mentioned inequalities (1) and (2) and:

$$L_1=L_2-\lambda/2+k\lambda \quad (11)$$

($k$: integer)

If equation (11) is satisfied, the frequency difference between two resonant modes D is zero and the phase difference therebetween is 180°, so that a double mode filter cannot be formed. Therefore, it is necessary to determine center distances $L_1$ and $L_2$ to such values as to satisfy inequalities (1) to (3).

The relationship between distances $L_1$ and $L_2$ determines a certain phase. Therefore, if one of the electrode fingers of the comb electrodes at the outer ends in the surface wave propagation direction is removed or if an electrode finger is added, it is necessary to determine the relationship between distances $L_1$ and $L_2$ by considering the phase determined by the relationship between distances $L_1$ and $L_2$.

If the structure shown in FIG. 1 is changed by increasing the number of electrode fingers of the comb electrode 12b by one, as shown in FIG. 8A, or by increasing the number of electrode fingers of the comb electrode 14b by one, as shown in FIG. 8B, the distance is apparently changed to $L'_1=(L_1-\lambda/2)$. In such cases, however, the phase relationship of surface waves is not changed, so that there is no change in the resulting filter characteristic.

Figure 9A:
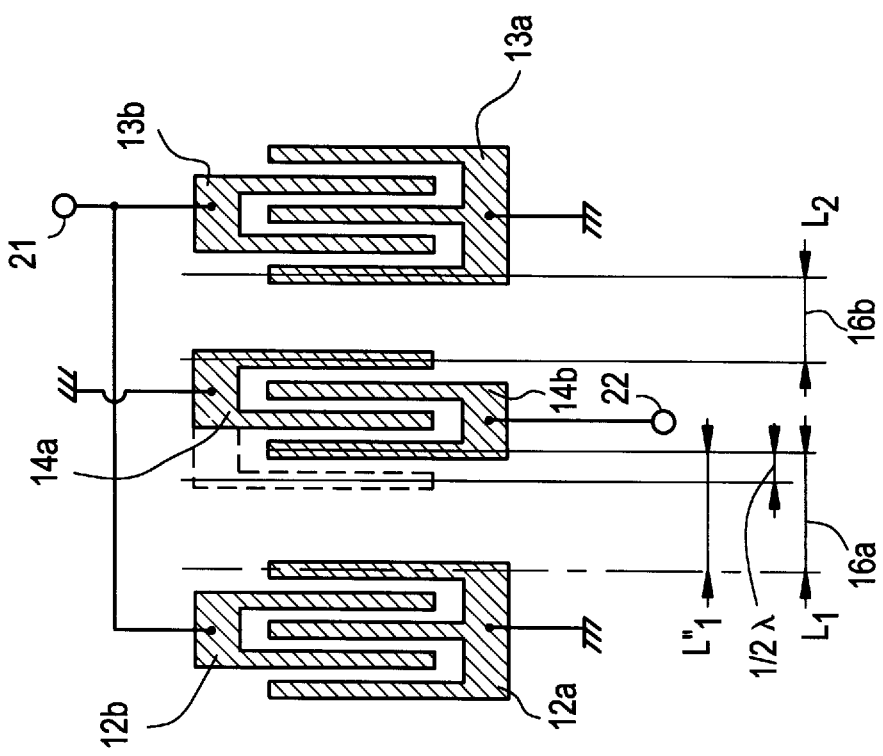
FIGS. 9A and 9B are schematic plan views of a portion where IDTs are formed, showing cases where the center distance is apparently changed when one of the electrode fingers is removed.
Figure 9B:
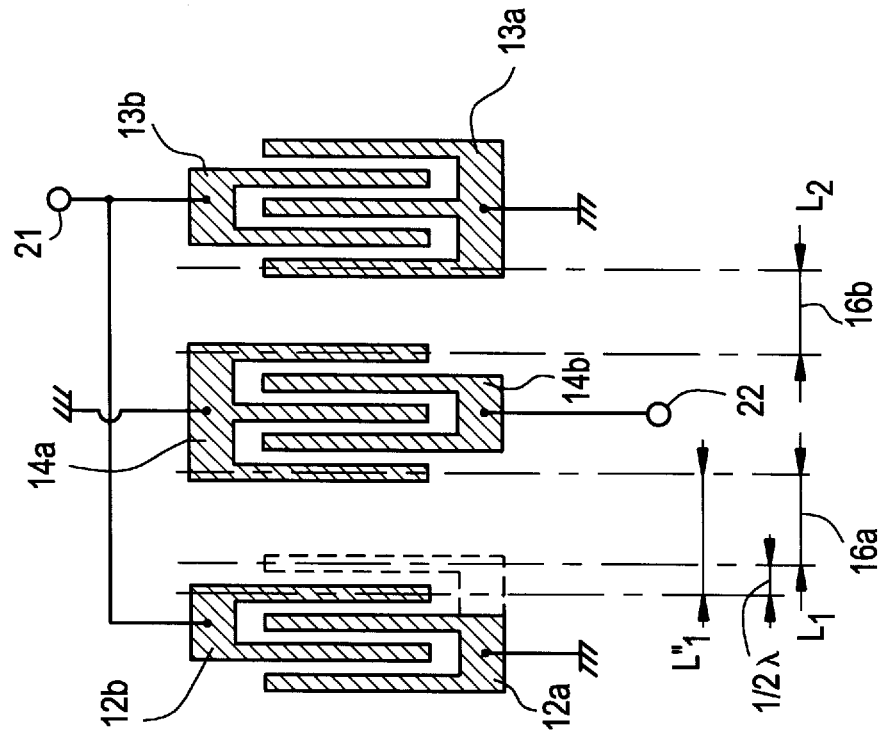

FIG. 9A shows an arrangement of removing one of the electrode fingers of the comb electrode 12a in the structure shown in FIG. 1, and FIG. 9B shows an arrangement of removing one of the electrode fingers of the comb electrode 14a in the same structure. In these arrangements, distance $L''_1=(L_1+\lambda/2)$. However, there is no change in the resulting filter characteristic.

The cases where the distance $L_1$ is apparently changed have been described with reference to FIGS. 8 and 9. However, the same description can be made with respect to distance $L_2$. That is, each of distances $L_1$ and $L_2$ is set as the distance between the centers of the adjacent-end electrode fingers both of which are connected to ground, or one of which is connected to an input end while the other of which is connected to an output end.

Figure 10:
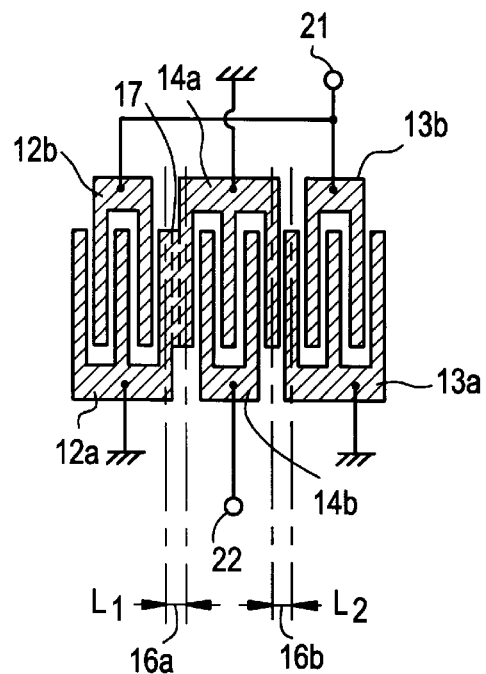
FIG. 10 is a schematic plan view of a case where the adjacent-end electrode fingers of an adjacent pair of IDTs are connected by the electrode material.

While the distances satisfy the conditions represented by the above-described equations (1) to (3), an electrical connection may be established between the electrode fingers of the comb electrode 12a and the comb electrode 14a at the adjacent ends of these electrodes and/or between the adjacent electrode fingers of the comb electrode 13a and the comb electrode 14a by using the same electroconductive material as the material of the comb electrodes. FIG. 10 shows an example of a structure in which the adjacent electrode fingers of the comb electrode 12a and 14a are connected to each other.

In the structure shown in FIG. 10, the gap between electrode fingers of the comb electrodes 12a and 14a at the adjacent ends of these electrodes is filled with an electrode material 17 which is the same electroconductive material as that of the comb electrodes.

As is apparent from FIGS. 8A, 8B, 9A, 9B and FIG. 10, it is necessary to determine distances $L_1$ and $L_2$ of the preferred embodiments of the present invention so as to maintain the same relationship between the phase of surface waves in the first IDT and the phases of surface waves in the second and third IDTs.

The SAW resonator filter of the preferred embodiments of the present invention will be described with respect to experimental examples thereof.

Figure 5:
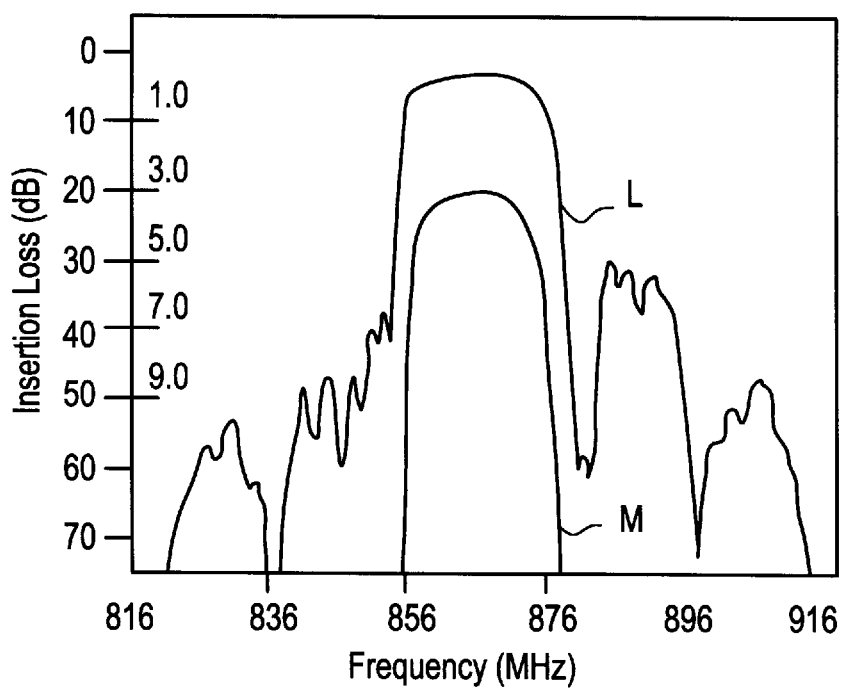
FIG. 5 is a diagram showing an insertion loss-frequency characteristic of a SAW resonator filter device shown in FIG. 11A as a second preferred embodiment of the present invention.

FIG. 5 shows an example of a characteristic of an RF filter arranged for use in a cordless telephone set of the CT-2 system in accordance with the preferred embodiments of the present invention and having a center frequency of about 866 MHz.

Figure 11A:
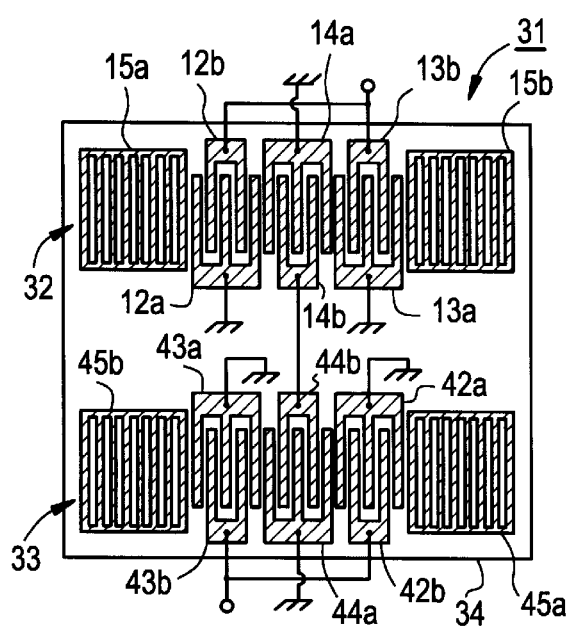
FIGS. 11A are 11B are plan views of SAW resonator filter devices according to second and third preferred embodiments of the present invention.

The filter having the characteristic shown in FIG. 5 is designed as a two-stage longitudinally coupled SAW resonator filter device 31 shown in FIG. 11A. As shown in FIG. 11A, SAW resonator filters 32 and 33 are constructed on a substantially rectangular piezoelectric substrate 34. The SAW resonator filter 32 preferably has the same electrode structure as the SAW resonator filter 10 shown in FIG. 1. Therefore, the IDTs and reflectors corresponding to those shown in FIG. 1 are indicated by the same reference characters and the detailed description for them will not be repeated.

The SAW resonator filter 33 also preferably has the same electrode structure as the SAW resonator filter 32. Therefore, the electrodes of the SAW resonator filter 33 are indicated by adding 30 to each of the numbers designating the electrodes of the SAW resonator filter 32, and the description for them will not be repeated.

As shown in FIG. 11A, the comb electrode 14b of the SAW resonator filter 32 is connected to the comb electrode 44b of the SAW resonator filter 33, thereby connecting the SAW resonator filters 32 and 33 in series.

More specifically, each of the SAW resonator filters 32 and 33 was constructed by setting the film thickness of the electrode members made of Al and forming the comb electrodes and the reflectors to 3.6% of $\lambda$ which is the wavelength of surface waves, by setting the numbers of electrode fingers of the first to third IDTs to 65, 37 and 37, respectively, by setting the numbers of electrode fingers of reflectors 15a, 15b, 45a, and 45b to 150, by setting distance $L_1=0.30\lambda$ and distance $L_2=0.64\lambda$, and by using 36°-rotated Y-cut X-propagation $LiTaO_3$ for piezoelectric substrate 34.

In the two-stage longitudinally coupled SAW resonator filter device 31, as can be read from FIG. 5, a −4 dB pass band width of about 13 MHz, i.e., 1.5% in terms of relative pass band width was obtained and improved selectivity was achieved in a frequency range in the vicinity of the pass band. Also, at the point of 866 MHz+20 MHz where a strong demand for a sufficiently large attenuation should be satisfied, a large attenuation of 30 dB was achieved.

The characteristic curve M shown in FIG. 5 represents an essential portion of the characteristic indicated by L, which is replotted by enlarging the insertion loss on the ordinate, that is, by using the scale on the right-hand side of the ordinate to represent the insertion loss.

Figure 6:
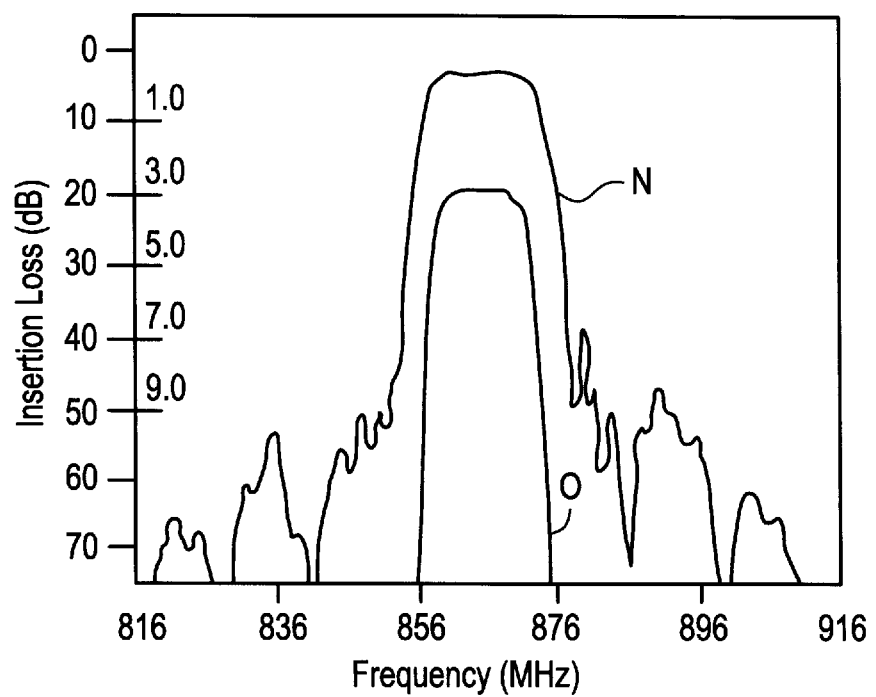
FIG. 6 is a diagram showing an insertion loss-frequency characteristic of the SAW resonator filter device shown in FIG. 11A when a withdrawal weighting method is used.

FIG. 6 shows a characteristic improved by combining the well-known withdrawal weighting method with the arrangement of the above-described SAW resonator filter device 31. The characteristic curve O represents an essential portion of the characteristic curve N with the insertion loss on the ordinate enlarged. As can be understood from FIG. 6, the attenuation in the stop band in the vicinity of the pass band could be further improved by combining the withdrawal weighting method, and a large attenuation of 45 dB or more was achieved at the point of 866 MHz+20 MHz.

As is apparent from the characteristics shown in FIGS. 5 and 6, the preferred embodiments of the present invention can be utilized to improve the attenuation in the stop band higher than the pass band while the electrode fingers are still formed as single electrodes, so that there is no need for manufacturing a split electrode structure requiring advanced processing techniques with respect to high frequencies. It is therefore possible to achieve adaptation for operation at higher radio frequencies without reducing the productivity.

Figure 11B:
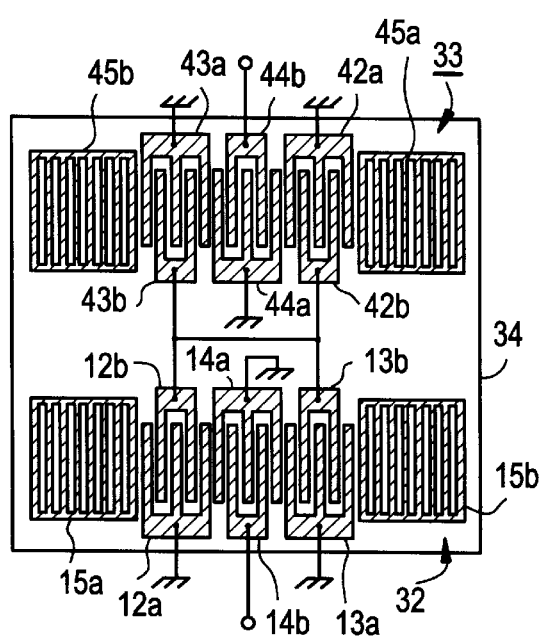

While the SAW resonator filters 32 and 33 in the arrangement shown in FIG. 11A are connected in the above-described manner, comb electrodes 12b and 13b of the SAW resonator filter 32 may be connected to comb electrodes 43b and 42b of the SAW resonator filter 33 as shown in FIG. 11B.

Figure 12:
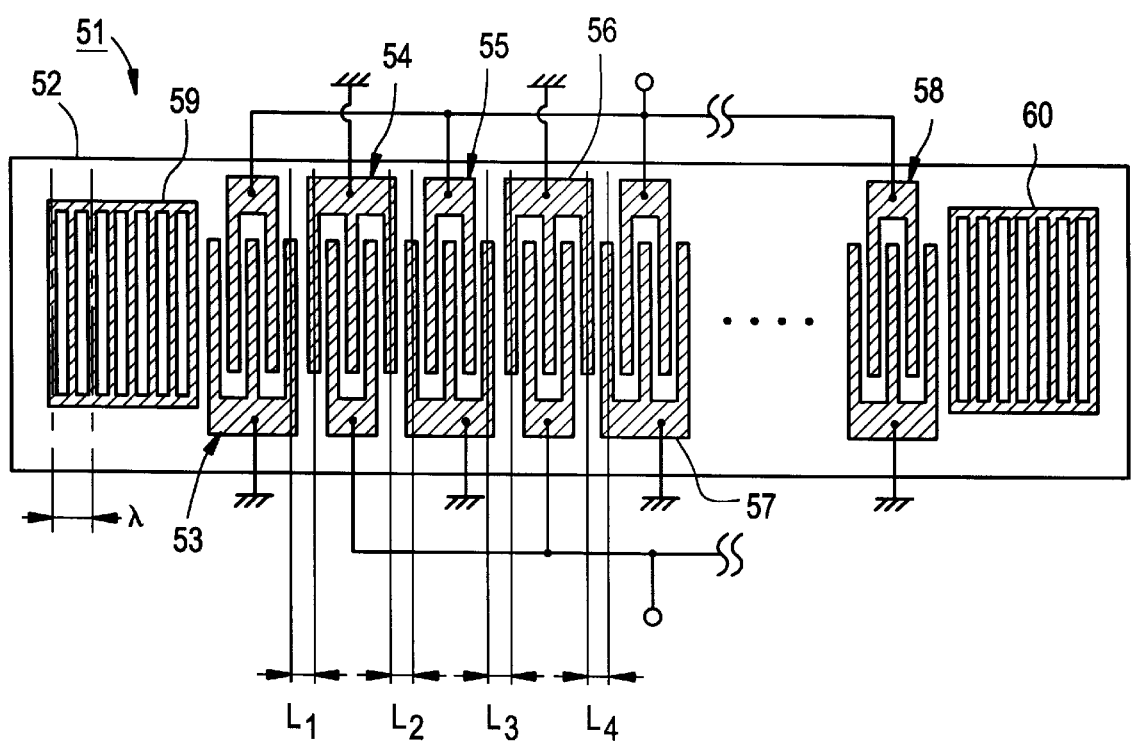
FIG. 12 is a plan view of a SAW resonator filter device according to a fourth preferred embodiment of the present invention.

FIG. 12 is a schematic plan view of a longitudinally coupled SAW resonator filter which represents a fourth preferred embodiment of the present invention. As the first to third preferred embodiments of the present invention, examples of the application of the present invention to a longitudinally coupled SAW resonator filter having three IDTs have been described. However, the preferred embodiments of the present invention can also be applied to a multiple IDT SAW resonator filter, such as that shown in FIG. 12, having four or more sets of IDTs.

That is, in a SAW resonator filter 51 shown in FIG. 12, a plurality of IDTs 53 to 58 are arranged in the surface wave propagation direction, and reflectors 59 and 60 are disposed on the opposite sides in the surface wave propagation direction of the area in which the IDTs 53 to 58 are formed. As materials for forming a piezoelectric substrate 52, IDTs 53 to 58 and reflectors 59 and 60, the same materials as those in the SAW resonator filters of the first to third preferred embodiments can be used.

In the longitudinally coupled SAW resonator filter 51 having more than four sets of IDTs 53 to 58 formed in this manner, the IDTs and reflectors are formed so as to satisfy equations (4) and (5) and inequalities (6) to (10) shown below, thereby achieving the same advantages as those of the longitudinally coupled SAW resonator filters of the first to third preferred embodiments.

That is, IDTs 53 to 58 are formed so that the distance between the centers of the adjacent-end electrode fingers of each adjacent pair of IDTs is selected so as to satisfy the following equations:

$$L_S = L_1 = L_3 = L_5 \ldots \quad (4)$$

$$L_A = L_2 = L_4 = L_6 \ldots \quad (5)$$

Also, if the wavelength of surface waves determined by the electrode finger pitch of reflectors 59 and 60 is $\lambda$, the distances $L_S$ and $L_A$ are selected so as to satisfy the following inequalities:

$$0 + n\lambda \leq L_S \leq \lambda/2 + n\lambda \quad (6)$$

(n: integer)

$$\lambda/2 + m\lambda \leq L_A \leq (m+1)\lambda \quad (7)$$

(m: integer)

or the following inequalities:

$$\lambda/2 + n\lambda \leq L_S \leq (n+1)\lambda \quad (8)$$

(n: integer)

$$0 + m\lambda \leq L_A \leq \lambda/2 + m\lambda \quad (9)$$

(m: integer)

Further, the distances $L_S$ and $L_A$ are selected so as to satisfy the following inequality:

$$L_S \neq L_A - \lambda/2 + k\lambda \quad (10)$$

(k: integer)

According to the preferred embodiments of the present invention, in the longitudinally coupled SAW resonator filter using the first to third IDTs, the distances $L_1$ and $L_2$ are set to different values. This makes it possible to provide a double-mode longitudinally coupled SAW resonator filter using two resonant modes determined by the distances $L_1$ and $L_2$ and having improved selectivity.

That is, in the conventional longitudinally coupled resonator filter, the attenuation in a stop band higher than the pass band is not sufficiently large because of a response of IDT in the stop band. In contrast, in the above-described new double-mode longitudinally coupled SAW resonator filter, the distances $L_1$ and $L_2$ are set to different values, and two resonant modes determined by these distances are excited, thereby effectively improving the attenuation in the stop band so that it is higher than the pass band.

According to the preferred embodiments of the present invention, only setting the distances $L_1$ and $L_2$ between the electrode fingers to different values may suffice, as described above, and there is no need for advanced processing techniques. Therefore, the same productivity as that of the conventional SAW resonator filter can be maintained. If the well-known withdrawal weighting method is also used, further improved selectivity can be achieved.

Further, a longitudinally coupled SAW resonator filter having four or more IDTs may be constructed, as shown in FIG. 12, as well as the longitudinally coupled SAW resonator filter having three IDTs.

A plurality of SAW resonator filters according to at least one preferred embodiment of the present invention may be connected in series on one piezoelectric substrate or the SAW resonator filter of the preferred embodiments of the present invention may be connected to a different SAW element such as a SAW resonator filter or a trap filter on one substrate. In this manner, longitudinally coupled SAW resonator filters adapted for various kinds of use can be provided as integrated devices. Also in such cases, the longitudinally coupled SAW resonator filter of at least one preferred embodiment of the present invention can operate with sufficiently high selectivity no matter what the connection arrangement.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A longitudinally coupled surface acoustic wave resonator filter comprising:
   a substrate;
   first, second and third interdigital transducers disposed on a surface of said substrate;
   said second and third interdigital transducers being located on opposite sides of said first interdigital transducer in a direction of propagation of surface waves excited and received by said first interdigital transducer;

first and second reflectors located on said substrate at opposite ends of an area in which said first, second and third interdigital transducers are provided;

each of said first, second and third interdigital transducers including a pair of comb electrodes each having at least one electrode finger; and a distance $L_1$ between centers of the at least one electrode finger of said first interdigital transducer and the at least one electrode finger of said second interdigital transducer located adjacent to each other and a distance $L_2$ between centers of the at least one electrode finger of said first interdigital transducer and the at least one electrode finger of said third interdigital transducer located adjacent to each other being set to different values; wherein each of said first and second reflectors has a plurality of electrode fingers arranged substantially perpendicularly to the surface wave propagation direction, a wavelength of surface waves determined by an electrode pitch of the reflectors is $\lambda$ and said distance $L_1$ satisfies an inequality (1):

$$0+n\lambda \leq L_1 \leq \lambda/2+n\lambda \qquad (1)$$

($n$: an integer)

said distance $L_2$ satisfies an inequality (2):

$$\lambda/2+m\lambda \leq L_2 \leq (m+1)\lambda \qquad (2)$$

($m$: an integer)

said distance $L_1$ and $L_2$ satisfy an inequality (3):

$$L_1 \neq L_2 - \lambda/2 + k\lambda \qquad (3)$$

($k$: an integer).

2. A longitudinally coupled surface acoustic wave resonator filter according to claim 1, wherein said substrate comprises one of a piezoelectric substrate and a substrate including a piezoelectric thin film disposed thereon.

3. A double mode filter comprising:

a longitudinally coupled surface acoustic wave resonator filter including first, second and third interdigital transducers disposed on a surface of said substrate, said second and third interdigital transducers being located on opposite sides of said first interdigital transducer in a direction of propagation of surface waves excited and received by said first interdigital transducer, first and second reflectors located on said substrate at opposite ends of an area in which said first, second and third interdigital transducers are provided, each of said first, second and third interdigital transducers including a pair of comb electrodes each having at least one electrode finger, and a distance $L_1$ between centers of the at least one electrode finger of said first of interdigital transducer and the at least one electrode finger of said second interdigital transducer located adjacent to each other and a distance $L_2$ between centers of the at least one electrode finger of said first interdigital transducer and the at least one electrode finger of said third interdigital transducer located adjacent to each other being set to different values; wherein each of said first and second reflectors has a plurality of electrode fingers arranged substantially perpendicularly to the surface wave propagation direction, a wavelength of surface waves determined by an electrode pitch of the reflectors is $\lambda$ and said distance $L_1$ satisfies a relationship (1):

$$0+n\lambda \leq L_1 \leq \lambda/2+n\lambda \qquad (1)$$

(for any value of $n$ where $n$ is an integer)

said distance $L_2$ satisfies a relationship (2):

$$\lambda/2+m\lambda \leq L_2 \leq (m+1)\lambda \qquad (2)$$

(for any value of $m$ where $m$ is an integer)

said distances $L_1$ and $L_2$ do not satisfy a relationship (3):

$$L_1 = L_2 - \lambda/2 + k\lambda \qquad (3)$$

(for all values of $k$ where $k$ is any integer)

such that two resonant modes are defined in the double mode filter;

at least one of a longitudinally coupled surface acoustic wave resonator filter, a transversely coupled surface acoustic wave resonator filter and a trap filter including a surface acoustic wave resonator disposed on the substrate and electrically connected to said longitudinally coupled surface acoustic wave resonator filter.

4. A multiple-IDT longitudinally coupled surface acoustic wave resonator filter comprising:

a substrate;

first to Xth (X: an integer equal to or larger than 4) interdigital transducers disposed on a surface of said substrate;

said second to Xth interdigital transducers being arranged to extend along a direction of propagation of surface waves excited and received by said first interdigital transducer;

first and second reflectors located on said substrate at opposite sides of an area in which said first to Xth interdigital transducers are provided; and each of said interdigital transducers including a pair of comb electrodes each having at least one electrode finger; wherein distances between adjacent-end electrode fingers of adjacent pairs of said interdigital transducers are $L_1, L_2, \ldots L_{X-1}$ and the distances satisfy equations (4) and (5):

$$L_S = L_1 = L_3 = L_5 \ldots \qquad (4)$$

$$L_A = L_2 = L_4 = L_6 \ldots \qquad (5)$$

wherein, a wavelength of surface waves determined by an electrode finger pitch of said reflectors is $\lambda$ and said distances $L_S$ and $L_A$ satisfy inequalities (6) and (7):

$$0+n\lambda \leq L_S \leq \lambda/2+n\lambda \qquad (6)$$

($n$: integer)

$$\lambda/2+m\lambda \leq L_A \leq (m+1)\lambda \qquad (7)$$

($m$: integer)

or inequalities (8) and (9):

$$\lambda/2+n\lambda \leq L_S \leq (n+1)\lambda \qquad (8)$$

($n$: integer)

$$0+m\lambda \leq L_A \leq \lambda/2+m\lambda \qquad (9)$$

($m$: integer), and the distances $L_S$ and $L_A$ satisfy an inequality (10):

$$L_S \neq L_A - \lambda/2 + k\lambda \qquad (10)$$

(k: integer).

5. An electronic component comprising:

a substrate;

a plurality of longitudinally coupled surface acoustic wave resonator filters located on said substrate and connected in series to each other, each of said plurality longitudinally coupled surface acoustic wave filters including:

first, second and third interdigital transducers disposed on a surface of said substrate;

said second and third interdigital transducers being located on opposite sides of said first interdigital transducer in a direction of propagation of surface waves excited and received by said first interdigital transducer;

first and second reflectors located on said substrate at opposite ends of an area in which said first, second and third interdigital transducers are provided;

each of said first, second and third interdigital transducers including a pair of comb electrodes each having at least one electrode finger; and a distance $L_1$ between centers of the at least one electrode finger of said first interdigital transducer and the at least one electrode finger of said second interdigital transducer located adjacent to each other and a distance $L_2$ between centers of the at least one electrode finger of said first interdigital transducer and the at least one electrode finger of said third interdigital transducer located adjacent to each other being set to different values; wherein each of said first and second reflectors has a plurality of electrode fingers arranged substantially perpendicularly to the surface wave propagation direction, a wavelength of surface waves determined by an electrode pitch of the reflectors is $\lambda$ and said distance $L_1$ satisfies an inequality (1):

$$0 + n\lambda \leq L_1 \leq \lambda/2 + n\lambda \qquad (1)$$

(n: an integer)

said distance $L_2$ satisfies an inequality (2):

$$\lambda/2 + m\lambda \leq L_2 \leq (m+1)\lambda \qquad (2)$$

(m: an integer)

said distance $L_1$ and $L_2$ satisfy an inequality (3):

$$L_1 \neq L_2 - \lambda/2 + k\lambda \qquad (3)$$

(k: an integer).

6. A surface acoustic wave resonator filter device comprising:

a longitudinally coupled surface acoustic wave resonator filter including first, second and third interdigital transducers disposed on a surface of said substrate, said second and third interdigital transducers being located on opposite sides of said first interdigital transducer in a direction of propagation of surface waves excited and received by said first interdigital transducer, first and second reflectors located on said substrate at opposite ends of an area in which said first, second and third interdigital transducers are provided, each of said first, second and third interdigital transducers including a pair of comb electrodes each having at least one electrode finger and a distance $L_1$ between centers of the at least one electrode finger of said first interdigital transducer and the at least one electrode finger of said second interdigital transducer located adjacent to each other and a distance $L_2$ between centers of the at least one electrode finger of said first interdigital transducer and the at least one electrode finger of said third interdigital transducer located adjacent to each other being set to different values; wherein each of said first and second reflectors has a plurality of electrode fingers arranged substantially perpendicularly to the surface wave propagation direction, a wavelength of surface waves determined by an electrode pitch of the reflectors is $\lambda$ and said distance $L_1$ satisfies an inequality (1):

$$0 + n\lambda \leq L_1 \leq \lambda/2 + n\lambda \qquad (1)$$

(n: an integer)

said distance $L_2$ satisfies an inequality (2):

$$\lambda/2 + m\lambda \leq L_2 \leq (m+1)\lambda \qquad (2)$$

(m: an integer)

said distance $L_1$ and $L_2$ satisfy an inequality (3):

$$L_1 \neq L_2 - \lambda/2 + k\lambda \qquad (3)$$

(k: an integer);

and at least one of a longitudinally coupled surface acoustic wave resonator filter, a transversely coupled surface acoustic wave resonator filter and a trap filter including a surface acoustic wave resonator disposed on the substrate and electrically connected to said longitudinally coupled surface acoustic wave resonator filter.

7. A double mode filter comprising a substrate;

first, second and third interdigital transducers disposed on a surface of said substrate;

said second and third interdigital transducers being located on opposite sides of said first interdigital transducer in a direction of propagation of surface waves excited and received by said first interdigital transducer;

first and second reflectors located on said substrate at opposite ends of an area in which said first, second and third interdigital transducers are provided;

each of said first, second and third interdigital transducers including a pair of comb electrodes each having at least one electrode finger; and a distance $L_1$ between centers of the at least one electrode finger of said first interdigital transducer and the at least one electrode finger of said second interdigital transducer located adjacent to each other and a distance $L_2$ between centers of the at least one electrode finger of said first interdigital transducer and the at least one electrode finger of said third interdigital transducer located adjacent to each other being set to different values; wherein each of said first and second reflectors has a plurality of electrode fingers arranged substantially perpendicularly to the surface wave propagation direction, a wavelength of surface waves determined by an electrode pitch of the reflectors is $\lambda$ and said distance $L_1$ satisfies a relationship (1):

$$0 + n\lambda \leq L_1 \leq \lambda/2 + n\lambda \quad (1)$$

(for all values of $n$ where $n$ is any integer)

said distance $L_2$ satisfies a relationship (2):

$$\lambda/2 + m\lambda \leq L_2 \leq (m+1)\lambda \quad (2)$$

(for all values of $m$ where $m$ is any integer)

said distances $L_1$ and $L_2$ do not satisfy a relationship (3):

$$L_1 = L_2 - \lambda/2 + k\lambda \quad (3)$$

(for all values of $k$ where $k$ is any integer)

such that two resonant modes are defined in the double mode filter.

8. The double mode filter according to claim 7, wherein said substrate comprises one of a piezoelectric substrate and a substrate including a piezoelectric thin film disposed thereon.

9. A double mode filter comprising:

a substrate;

first to Xth (X is any integer equal to or larger than 4) interdigital transducers disposed on a surface of said substrate;

said second to Xth interdigital transducers being arranged to extend along a direction of propagation of surface waves excited and received by said first interdigital transducer;

first and second reflectors located on said substrate at opposite sides of an area in which said first to Xth interdigital transducers are provided; and each of said interdigital transducers including a pair of comb electrodes each having at least one electrode finger; wherein distances between adjacent end electrode fingers of adjacent pairs of said interdigital transducers are $L_1, L_2, \ldots L_{x-1}$ and the distances satisfy equations (4) and (5):

$$L_S = L_1 = L_3 = L_5 \ldots \quad (4)$$

$$L_A = L_2 = L_4 = L_6 \ldots \quad (5)$$

wherein a wavelength of surface waves determined by an electrode finger pitch of said reflectors is $\lambda$ and said distances $L_s$ and $L_A$ satisfy relationships (6) and (7):

$$0 + n\lambda \leq L_S \leq \lambda/2 + n\lambda \quad (6)$$

(for any value of $n$ where $n$ is an integer)

$$\lambda/2 + m\lambda \leq L_A \leq (m+1)\lambda \quad (7)$$

(for any value of $m$ where $m$ is an integer)

or relationships (8) and (9):

$$0 + n\lambda \leq L_S \leq (n+1)\lambda \quad (8)$$

(for any value of $n$ where $n$ is an integer)

$$0 + m\lambda \leq L_A \leq \lambda/2 + m\lambda \quad (9)$$

(for any value of $m$ where $m$ is an integer)

and said distances $L_1$ and $L_2$ do not satisfy a relationship (10):

$$L_S = L_A - \lambda/2 + k\lambda \quad (10)$$

(for all values of $k$ where $k$ is any integer)

such that two resonant modes are defined in the double mode filter.

10. A double mode filter comprising:

a substrate;

a plurality of longitudinally coupled surface acoustic wave resonator filters located on said substrate and connected in series to each other, each of said plurality of longitudinally coupled surface acoustic wave filters including:

first, second and third interdigital transducers disposed on a surface of said substrate;

said second and third interdigital transducers being located on opposite sides of said first interdigital transducer in a direction of propagation of surface waves excited and received by said first interdigital transducer;

first and second reflectors located on said substrate at opposite ends of an area in which said first, second and third interdigital transducers are provided;

each of said first, second and third interdigital transducers including a pair of comb electrodes each having at least one electrode finger; and a distance $L_1$ between centers of the at least one electrode finger of said first interdigital transducer and the at least one electrode finger of said second interdigital transducer located adjacent to each other and a distance $L_2$ between centers of the at least one electrode finger of said first interdigital transducer and the at least one electrode finger of said third interdigital transducer located adjacent to each other being set to different values; wherein each of said first and second reflectors has a plurality of electrode fingers arranged substantially perpendicularly to the surface wave propagation direction, a wavelength of surface waves determined by an electrode pitch of the reflectors is $\lambda$ and said distance $L_1$ satisfies a relationship (1):

$$0 + n\lambda \leq L_1 \leq \lambda/2 + n\lambda \quad (1)$$

(for any value of $n$ where $n$ is an integer)

said distance $L_2$ satisfies a relationship (2):

$$\lambda/2 + m\lambda \leq L_2 \leq (m+1)\lambda \quad (2)$$

(for any value of $m$ where $m$ is an integer)

said distances $L_1$ and $L_2$ do not satisfy a relationship (3):

$$L_1 = L_2 - \lambda/2 + k\lambda \quad (3)$$

(for all values of $k$ where $k$ is any integer)

such that two resonant modes are defined in the double mode filter.

* * * * *